United States Patent [19]

Chow et al.

[11] Patent Number: 4,920,403
[45] Date of Patent: Apr. 24, 1990

[54] SELECTIVE TUNGSTEN INTERCONNECTION FOR YIELD ENHANCEMENT

[75] Inventors: Yu C. Chow; Kuan Y. Liao, both of Irvine; Maw-Rong Chin; Charles S. Rhoades, both of Huntington Beach, all of Calif.

[73] Assignee: Hughes Aircraft Company, Los Angeles, Calif.

[21] Appl. No.: 338,682

[22] Filed: Apr. 17, 1989

[51] Int. Cl.$^5$ .................. H01L 23/48; B44C 1/22; C23F 1/02
[52] U.S. Cl. .................................. 357/71; 156/626; 156/650; 156/656; 156/659.1; 357/67; 437/192; 437/246
[58] Field of Search ............... 437/189, 192, 194, 195, 437/201, 245, 246; 156/626, 643, 650, 652, 656, 654.1, 664, 665; 357/67, 71

[56] References Cited

U.S. PATENT DOCUMENTS

| | | | |
|---|---|---|---|
| 4,517,225 | 5/1985 | Broadbent | 437/246 X |
| 4,648,175 | 3/1987 | Metz et al. | 437/193 X |
| 4,666,737 | 5/1987 | Gimpelson et al. | 437/192 |

Primary Examiner—William A. Powell
Attorney, Agent, or Firm—Terje Gudmestad; Wanda K. Denson-Low

[57] ABSTRACT

Methods of fabricating metal interconnection lines in an integrated circuit. In general, one method comprises the steps of depositing a layer of metal on an inter-dielectric oxide layer. The layer of metal is patterned and etched to form metal interconnection lines over the oxide layer. Tungsten is selectively deposited onto the etched layer to completely form the metal interconnection lines. Additionally, in a second method, a layer of tungsten may be deposited prior to the layer of metal. This forms a metal line that is completely encapsulated in tungsten. In addition, selective tungsten employed to repair broken metal lines in a fabricated integrated circuit. The selective tungsten is deposited using a chemical vapor deposition process and is deposited onto masked and etched second level (or higher) metal lines formed in the integrated circuit. The method of selectively depositing tungsten comprises the steps of exposing the metal interconnection lines to a mixture of $SiH_4$ at a rate between 3-10 standard cubic centimeters per minute, $WF_6$ at a rate between 3-25 standard cubic centimeters per minute, and $H_2$ at a rate between 25-100 standard cubic centimeters per minute. Then the exposed metal interconnection lines are processed at a pressure between 50-200 m Torr, a temperature between 250-350 degrees Celsius, and a deposition rate between 2000-10000 Angstroms per minute to form the fully interconnected metal lines. The present method improves the yields of multi-level metal integrated circuits and maximizes the potential gate usage therein. The conformal deposition of selective tungsten enhances the yields of integrated circuits and tungsten capping on aluminum metal lines, for example provides for a better electromigration resistance interconnection.

16 Claims, 2 Drawing Sheets a.

b.

c.

SELECTIVE TUNGSTEN INTERCONNECTION FOR YIELD ENHANCEMENT

BACKGROUND

The present invention relates generally to integrated circuit processing and more particularly to a method of repairing broken metal interconnection lines using selective tungsten deposition.

In high density integrated circuits such as gate arrays, for example, in order to achieve the maximum gate usage, multi-level metalization is employed. Typically, a second and third level of metal is deposited over intervening dielectric layers and underlying metalization layers that are interconnected by way of via interconnects to underlying gates. Typical integrated circuits employ 1.5 micron technology and the metal line spacings in this technology are on the order of 2.0 microns.

When an inter-dielectric oxide layer is deposited over a patterned metal layer, the closeness of the metal line spacing creates a trough in the oxide layer. The subsequently formed patterned metal layer often has breaks in the metal lines in the areas of these troughs.

Surface planarization techniques have been employed to attempt to minimize the formation of troughs and other voids. However, these techniques require numerous additional steps and do not always result in usable circuits. Consequently, the metal step coverage over abrupt trench and via openings is a major yield inhibitor in fabricating integrated circuits.

SUMMARY OF THE INVENTION

In order to improve the yields in fabricating multilevel metal integrated circuits, the present invention provides for methods of fabricating metal interconnection lines in an integrated circuit. In general, one method comprises the steps of depositing a layer of metal on an inter-dielectric oxide layer. The layer of metal is patterned and etched to form metal interconnection lines over the oxide layer. Tungsten is selectively deposited onto the etched layer to completely form the metal interconnection lines. Additionally, in a second method, a layer of tungsten may be deposited prior to the layer of metal. This forms a metal line that is completely encapsulated in tungsten.

More particularly, the methods of the present invention permit the repair of broken metal interconnection lines formed over the inter-dielectric oxide layer of an integrated circuit. This method comprises the steps of depositing a layer of metal over the inter-dielectric oxide layer, patterning the deposited layer of metal using a mask, and etching the patterned metal layer to form patterned metal interconnection lines over the inter-dielectric oxide layer. The metal interconnection lines may then be tested, if desired, to determine the presence of broken lines. In order to repair the broken lines, tungsten is selectively deposited onto the patterned metal interconnection lines to form fully interconnected metal lines. The tungsten is generally deposited by means of a chemical vapor deposition process, or the like. This procedure does not require an additional masking step to make the repairs.

The conformal deposition of selective tungsten enhances the yields of integrated circuits and tungsten capping on aluminum metal lines, for example provides for a better electromigration resistance interconnection. The selective tungsten is applied to the patterned metal lines to repair broken metal interconnections formed above narrow trenches. Due to the difficulty of depositing void-free dielectric, partial surface planarization may be used to provide smoother topography. The metal step coverage over abrupt trench and via openings is a major yield inhibitor, but the present invention provides a solution to enhance second and higher level metalization without additional masking steps. Consequently, the normally scrapped wafers caused by open metal lines can be reclaimed to yield usable die.

The present invention also provides for an alternate method of forming the interconnect lines which fully encapsulates them in tungsten. This improves the electromigration resistance of the metal interconnection lines. This method also repairs any broken lines of the integrated circuit due to the deposition of selective tungsten which fills any cracks or voids in the deposited metal lines. This alternate method is as follows. A layer of tungsten is deposited on the inter-dielectric oxide layer. Then a layer of metal is deposited on top of the layer of tungsten, from which the metal interconnection lines are formed. The layers of tungsten and metal are then etched to form the interconnection lines. Finally, a layer of selective tungsten is deposited over and around the interconnection lines. As a result of this procedure, metal interconnect lines are completely encapsulated in tungsten. This structure is highly resistant to electromigration problems without adversely affecting the current carrying capacity of the interconnect lines.

Thus, the present invention provides interconnection repair of second level metal or higher lines in deep trench areas. The die yields are enhanced using the conformal deposition of tungsten onto broken metal lines. The tungsten capping on aluminum and its alloy also provides a better electromigration resistance interconnection. The present method is a simple straight forward procedure to deposit a selective layer of tungsten overt patterned metal lines. The combined tungsten and aluminum layers enhance die yields and reliability against electromigration. The present method also reclaims the wafers that have marginal second level metal step coverage which would otherwise be scrapped.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 2b shows a cross sectional view of a portion of the multi-level metal integrated circuit of FIG. 2a.

DETAILED DESCRIPTION

Figure 1:
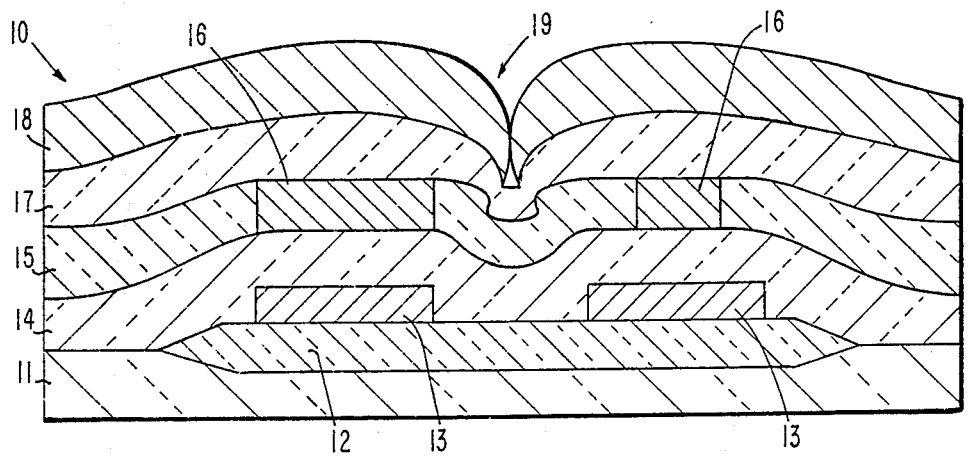
FIG. 1 illustrates an embodiment of a multi-level metal integrated circuit having undergone fabrication prior to its processing using the principles of the present invention.

Referring to FIG. 1, an embodiment of a multi-level metal integrated circuit 10 having undergone fabrication is shown. In particular, the integrated circuit 10 comprises a substrate 11 over which a field oxide layer 12 is formed. The substrate may generally comprises silicon, or the like. The field oxide layer 12 is typically grown to a thickness of about 8000 Angstroms. Polysilicon islands 13 are then formed over the field oxide layer 12 to a thickness of about 5000 Angstroms. A dielectric layer comprising a first oxide layer 14 is then deposited over the substrate to a thickness of about 6000 Angstroms.

A first layer of metal is deposited over the first oxide layer 14 and is masked and etched to form metal lines 16 above the first oxide layer 14. The metal lines 16 have a thickness of about 6000 Angstroms. These metal lines 16 overlay the polysilicon islands 13 and provide a means of connection thereto. A second layer of oxide is deposited over the first oxide layer 14 between the metal lines 16. An inter-dielectric oxide layer 17 is then deposited over the metal lines 16 and second oxide layer 15 to a thickness of about 1.3 microns. The inter-dielectric oxide layer 17 is generally comprised of phosphorous silicate glass (PSG), or the like. Finally, a second metal layer is deposited over the inter-dielectric layer 17, and is masked and etched to form a second level of metal lines 18 to a thickness of about 1 micron.

As is shown in FIG. 1, due to the relatively close spacing between the metal lines 16, the second and inter-dielectric oxide layers 15, 17 deposited thereover form a trench 19 in the inter-dielectric oxide layer 17. This trench 19 causes the formation of voids, or cracks in the subsequently deposited second level metal lines 18, as is shown in FIG. 1. In many instances, the second level metal lines 18 are not connected in the area of the trench 19. Consequently, the integrated circuits 10 so formed are not entirely operable.

Typically, in gate array circuits wherein the line spacing is on the order of 1.8 microns, numerous gate array die must be scrapped using conventional processing. In addition, as the line spacings become closer as integrated circuit technology produces denser and denser chip topologies, the problem gets worse. What has been done in the past was to use partial planarization techniques to smooth the dielectric layers 15, 17 deposited over the first layer of metal in order to minimize the formation of trenches. However, this has not been entirely effective.

Figure 2A:
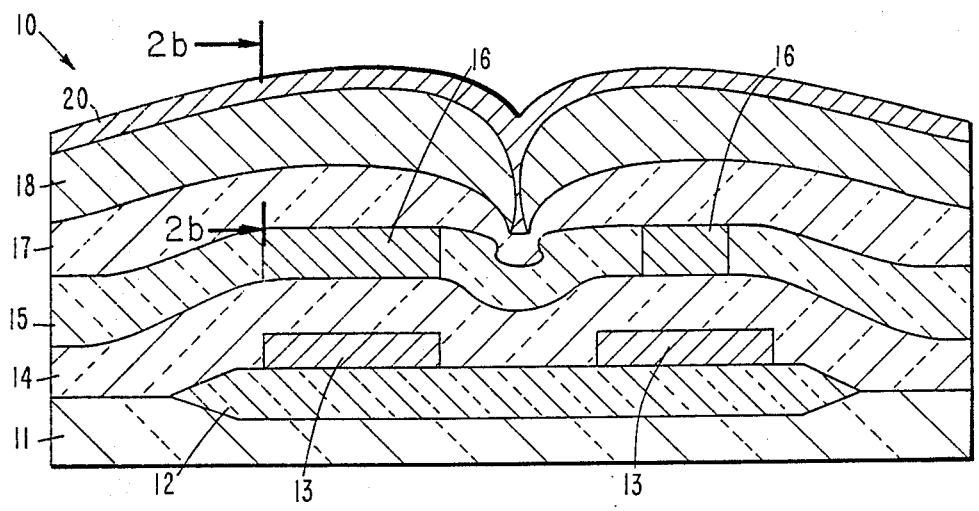
FIG. 2a illustrates the multi-level metal integrated circuit of FIG. 1 after processing by means of one method in accordance with the principles of the present invention.

Referring now to FIG. 2a, the methods of the present invention forms metal interconnection lines and overcomes the problems of broken metal lines by providing for a means to repair broken metal lines using a relatively simple procedure. As is shown in FIG. 2, a refractory metal such as selective tungsten, for example, and shown as selective tungsten layer 20, is deposited over the second set of metal lines 18 to fill the voids formed in the area of the trench 19. The selective tungsten layer 20 is deposited directly over the second metal lines 18 without additional masking or etching steps. The selective tungsten layer 20 is generally deposited using a chemical vapor deposition (CVD) procedure, or the like. In particular, the present method comprises the following steps.

The selective tungsten deposition procedure comprises using a mixture of silane ($SiH_4$) at a rate between 3-10 standard cubic centimeters per minute (sccm), tungsten hexafluoride ($WF_6$) at a rate between 3-10 sccm, and hydrogen ($H_2$) at a rate between 3-10 sccm, and deposited at a pressure between 50-200 mTorr, a temperature between 250-350 degrees Celsius, and a deposition rate between 2000-10000 Angstroms per minute. This produces a selective CVD tungsten layer 20 having a thickness of about 2000-3000 Angstroms.

Typically, the integrated circuit 10 is then processed to provide an overglass layer formed over the tungsten layer 20, followed by a bonding pad formed by a mask and etch procedure, a third metal layer deposition of about 3000 Angstroms and another bonding pad formed by a mask and etch procedure. This subsequent processing ensures that the top surface of the bonding pad is comprised of aluminum to facilitate packaging of the integrated circuit 10.

Figure 2B:
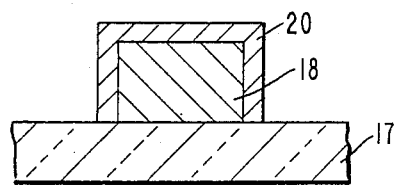

FIG. 2b shows a cross sectional view of the multi-level metal integrated circuit of FIG. 2a taken along the line indicated by arrow 2b. As can be readily seen from FIG. 2b, the metal interconnect line 18 surrounded on three sides by the selective tungsten layer 20.

Figure 3:
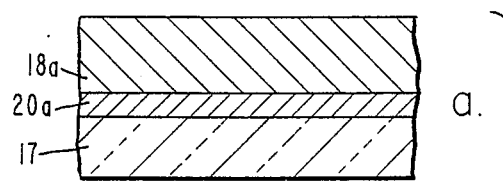
FIGS. 3a-c illustrate an alternate method of making metal interconnect lines for use in fabricating the integrated circuit of FIG. 2a which fully encapsulates the lines.
Figure 3:
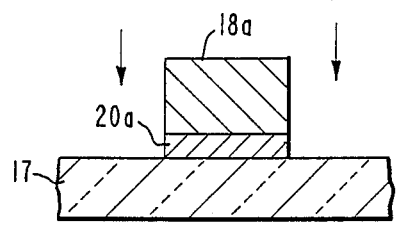
Figure 3:
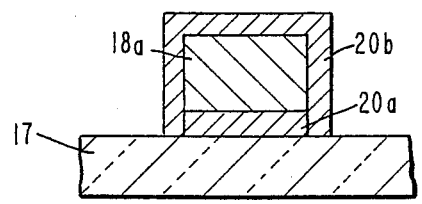

However, in certain instances, typically in high voltage applications, it might be advantageous to fully encapsulate the metal lines 18 in tungsten. This improves the electromigration resistance of the metal interconnection lines 18. FIGS. 3a-c illustrate an alternate method of making a metal interconnect lines which fully encapsulates them. This method is employed with reference to the integrated circuit of FIG. 2a.

The method is as follows. A layer of tungsten 20a is deposited on the inter-dielectric oxide layer 17. In addition, any refractory metal may be used as the metal layers 20a and 20b. Such metals include tungsten, platinum, titanium, titanium-tungsten, or other refractory alloy. This may be deposited using a conventional sputtering procedure, for example. Then a layer of metal 18a, such as aluminum, is deposited on top of the layer of tungsten 20a, from which the second metal lines 18 will be formed. The layers of tungsten 20a and metal 18a are then etched to form the structure shown in FIG. 3b. Finally, a layer of selective tungsten 20b is deposited over and around the structure of FIG. 3b in a manner as described above with respect to FIG. 2a.

As a result of this procedure, metal interconnect lines are completely encapsulated in tungsten. This structure is highly resistant to electromigration problems without adversely affecting the current carrying capacity of the interconnect lines 18.

Thus, there has been described new and improved methods of fabricating metal interconnect lines and repairing broken metal lines formed in multi-level metal integrated circuit chips. The present invention improves the yields in multi-level metal integrated circuits.

It is to be understood that the above-described embodiments are merely illustrative of some of the many specific embodiments which represent applications of the principles of the present invention. Clearly, numerous and other arrangements can be readily devised by those skilled in the art without departing from the scope of the invention. In particular, other selective tungsten deposition procedures may be devised by those skilled in the art, for example. Also, other materials may be employed to deposit the selective tungsten.

What is claimed is:

1. A method of repairing broken metal interconnection lines formed over an inter-dielectric oxide layer in an integrated circuit, said method comprising the steps of:

depositing a layer of metal over the inter-dielectric oxide layer;

patterning the deposited layer of metal using a mask;

etching the patterned metal layer to form patterned metal interconnection lines over the inter-dielectric oxide layer;

testing the metal interconnection lines to determine the presence of broken lines;

selectively depositing a refractory metal onto the metal interconnection lines to form fully interconnected metal lines.

2. The method of claim 1 wherein the step of selectively depositing the refractory metal comprises the step of:

selectively depositing tungsten by means of a chemical vapor deposition process.

3. The method of claim 2 wherein the step of selectively depositing tungsten comprises the steps of:

exposing the patterned metal interconnection lines to a mixture of $SiH_4$ at a rate between 3-10 standard cubic centimeters per minute, $WF_6$ at a rate between 3-25 standard cubic centimeters per minute, and $H_2$ at a rate between 25-100 standard cubic centimeters per minute; and processing the exposed metal interconnection lines a pressure between 50-200 mTorr, a temperature between 250-350 degrees Celsius, and a deposition rate between 2000-10000 Angstroms per minute.

4. A method of repairing broken metal interconnection lines formed over an oxide layer in an integrated circuit, said method comprising the steps of:

forming patterned metal interconnection lines over an oxide layer;

testing the metal interconnection lines to determine the presence of broken lines;

selectively depositing tungsten onto the metal interconnection lines to form fully interconnected metal lines.

5. The method of claim 4 wherein the step of selectively depositing tungsten comprises the step of:

selectively depositing tungsten by means of a chemical vapor deposition process.

6. The method of claim 5 wherein the step of selectively depositing tungsten comprises the steps of:

exposing the patterned metal interconnection lines to a mixture of $SiH_4$ at a rate between 3-10 standard cubic centimeters per minute, $WF_6$ at a rate between 3-25 standard cubic centimeters per minute, and $H_2$ at a rate between 25-100 standard cubic centimeters per minute; and processing the exposed metal interconnection lines a pressure between 50-200 mTorr, a temperature between 250-350 degrees Celsius, and a deposition rate between 2000-10000 Angstroms per minute.

7. In an integrated circuit having at least two layers of metal interconnection lines separated by an oxide layer, a method of repairing broken metal interconnection lines in the second layer, said method comprising the steps of:

forming patterned a second layer of metal interconnection lines over an oxide layer;

selectively depositing a refractory metal onto the metal interconnection lines to form fully interconnected metal lines.

8. The method of claim 7 wherein the step of selectively depositing the refractory metal comprises the step of:

selectively depositing tungsten by means of a chemical vapor deposition process.

9. The method of claim 7 wherein the step of selectively depositing tungsten comprises the steps of:

exposing the patterned metal interconnection lines to a mixture of $SiH_4$ at a rate between 3-10 standard cubic centimeters per minute, $WF_6$ at a rate between 3-25 standard cubic centimeters per minute, and $H_2$ at a rate between 25-100 standard cubic centimeters per minute; and processing the exposed metal interconnection lines a pressure between 50-200 mTorr, a temperature between 250-350 degrees Celsius, and a deposition rate between 2000-10000 Angstroms per minute.

10. In an integrated circuit having at least two layers of metal interconnection lines separated by an oxide layer and comprising:

a layer of metal interconnection formed lines over an oxide layer; and a tungsten layer selectively deposited onto the layer of metal interconnection lines to form fully interconnected metal lines.

11. A method of repairing broken metal interconnection lines formed over an inter-dielectric oxide layer in an integrated circuit, said method comprising the steps of:

depositing a layer of metal over the inter-dielectric oxide layer;

patterning the deposited layer of metal using a mask;

etching the patterned metal layer to form patterned metal interconnection lines over the inter-dielectric oxide layer;

selectively depositing tungsten onto the metal interconnection lines to form fully interconnected metal lines.

12. The method of claim 11 which further comprises the step of:

depositing a layer of tungsten on the inter-dielectric oxide layer prior to depositing the layer of metal thereon.

13. A method of fabricating metal interconnection lines in an integrated circuit, said method comprising the steps of:

depositing a layer of metal over an inter-dielectric oxide layer;

patterning the deposited layer of metal using a mask;

etching the patterned metal layer to form patterned metal interconnection lines over the inter-dielectric oxide layer;

depositing a refractory metal layer onto the metal interconnection lines to form fully interconnected metal lines.

14. The method of claim 11 which further comprises the step of:

depositing a refractory metal layer on the inter-dielectric oxide layer prior to depositing the layer of metal thereon.

15. The method of claim 13 wherein the step of depositing a refractory metal comprises the step of:

selectively depositing tungsten onto the etched layer to form metal interconnection lines.

16. The method of claim 14 which further comprises the step of:

depositing a layer of tungsten on the inter-dielectric oxide layer prior to depositing the layer of metal thereon.

* * * * *